United States Patent
Tsuda

(10) Patent No.: US 9,589,651 B1
(45) Date of Patent: Mar. 7, 2017

(54) SEMICONDUCTOR MEMORY DEVICE AND CONTROLLING METHOD THEREOF

(71) Applicant: KABUSHIKI KAISHA TOSHIBA, Minato-ku, Tokyo (JP)

(72) Inventor: Muneyuki Tsuda, Ichinomiya, Aichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/070,709

(22) Filed: Mar. 15, 2016

Related U.S. Application Data

(60) Provisional application No. 62/257,076, filed on Nov. 18, 2015.

(51) Int. Cl.
  *G11C 11/34* (2006.01)
  *G11C 16/14* (2006.01)

(52) U.S. Cl.
  CPC ................... *G11C 16/14* (2013.01)

(58) Field of Classification Search
  CPC ........................................ G11C 16/14
  USPC ............ 365/185.29, 185.01, 185.03, 185.11, 365/185.17, 185.18
  See application file for complete search history.

(56) References Cited

U.S. PATENT DOCUMENTS

| | | |
|---|---|---|
| 5,475,249 A | 12/1995 | Watsuji et al. |
| 6,894,931 B2 | 5/2005 | Yaegashi et al. |
| 8,179,720 B2 | 5/2012 | Fukuda et al. |
| 8,194,467 B2 | 6/2012 | Mikajiri et al. |
| 2016/0111165 A1* | 4/2016 | Shim ................. G11C 16/16 365/185.11 |

\* cited by examiner

*Primary Examiner* — Fernando Hidalgo
(74) *Attorney, Agent, or Firm* — Holtz, Holtz & Volek PC

(57) ABSTRACT

A semiconductor memory device according to an embodiment includes: a memory cell array including a plurality of charge accumulation type memory cells; and a control unit that controls the memory cell array. The control unit, when executing an erase operation on the memory cell array, applies an erase voltage to the memory cells. The erase voltage is a voltage in a pulse form. The control unit performs control that, compared to when the erase operation is in a first stage, increases a voltage value and shortens a pulse width of the erase voltage when the erase operation is in a second stage.

20 Claims, 12 Drawing Sheets

SEMICONDUCTOR MEMORY DEVICE AND CONTROLLING METHOD THEREOF

CROSS REFERENCE TO RELATED APPLICATIONS

This application is based on and claims the benefit of priority from prior U.S. prior provisional Patent Application No. 62/257,076, filed on Nov. 18, 2015, the entire contents of which are incorporated herein by reference.

BACKGROUND

Field

Embodiments described below relate to a semiconductor memory device.

Description of the Related Art

One kind of semiconductor memory device includes a flash memory. In particular, a NAND type flash memory is generally widely used since it is low cost and has a large capacity. Moreover, up to now, many technologies for further increasing the capacity of this NAND type flash memory have been proposed. One such technology is a structure in which memory cells are disposed three-dimensionally. In such a three-dimensional type semiconductor memory device, the memory cells are disposed in a stacking direction, and a conductive layer extends from those memory cells disposed in the stacking direction. Each of the memory cells comprises, between a semiconductor layer acting as a channel and a word line, a memory film that includes a charge accumulation layer.

In such a three-dimensional type semiconductor memory device, it is required that an erase speed in an erase operation is speeded up.

DETAILED DESCRIPTION

A semiconductor memory device according to an embodiment includes: a memory cell array including a plurality of charge accumulation type memory cells; and a control unit that controls the memory cell array. The control unit applies, when executing an erase operation on the memory cell array, an erase voltage in a pulse form to the memory cells. The control unit performs control that, compared to when the erase operation is in a first stage, increases a voltage value and shortens a pulse width of the erase voltage when the erase operation is in a second stage later than the first stage.

Semiconductor memory devices according to embodiments will be described below with reference to the drawings. Note that these embodiments are merely examples. For example, semiconductor memory devices described below have a structure in which a memory string extends linearly in a perpendicular direction to a substrate, but a similar operation may be applied also to a U-shaped structure in which the memory string is doubled back on an opposite side midway. In addition, each of the drawings of the semiconductor memory devices employed in the embodiments below is schematic, and thicknesses, widths, ratios, and so on, of layers are not necessarily identical to those of the actual semiconductor memory devices.

Moreover, the embodiments described below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor film acting as a channel provided in a column shape perpendicularly to a substrate; and a gate electrode film provided on a side surface of the semiconductor film via a charge accumulation layer. However, the embodiments described below may be applied also to two-dimensional type or three-dimensional type nonvolatile semiconductor memory devices having a structure in which a memory string is provided in a single layer or multiple layers in a substrate surface direction, the memory string including a memory cell of another form, for example, a SONOS (Semiconductor-Oxide-Nitride-Oxide-Semiconductor) type memory cell or a MANOS (Metal-Aluminum Oxide-Nitride-Oxide-Semiconductor) type memory cell, a memory cell employing hafnium oxide ($HfO_x$) or tantalum oxide ($TaO_x$) besides silicon nitride as a charge accumulation layer that includes numerous charge-trapping trap sites in an insulating film, or a memory cell similar to these.

First Embodiment

First, an overall configuration of a semiconductor memory device according to a first embodiment will be described.

Figure 1:
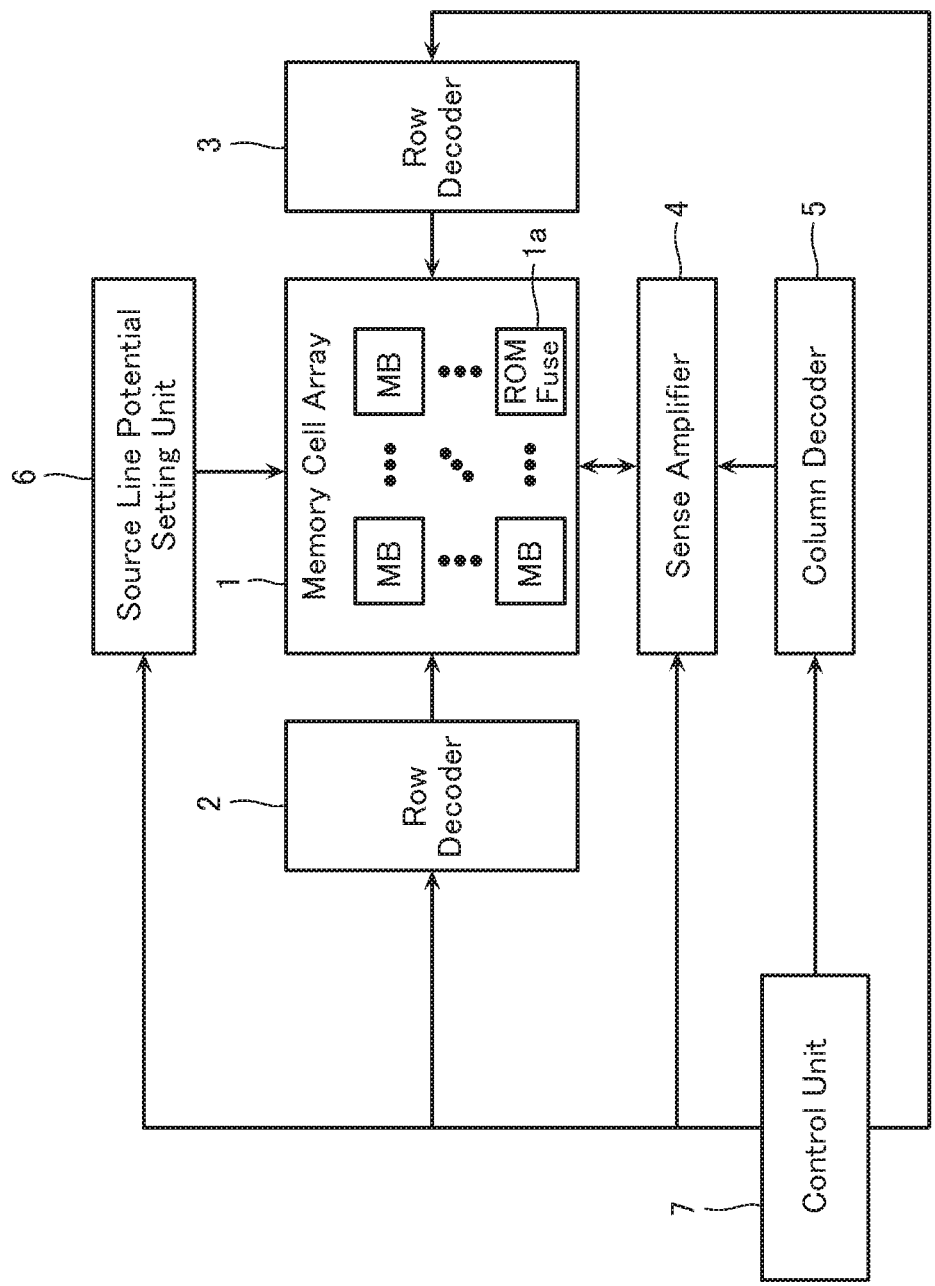
FIG. 1 is a block diagram explaining a configuration of a semiconductor memory device according to a first embodiment.

FIG. 1 is a block diagram explaining the configuration of the semiconductor memory device according to the first embodiment. This semiconductor memory device comprises: a memory cell array 1; row decoders 2 and 3; a sense amplifier 4; a column decoder 5; a source line potential setting unit 6; and a control unit 7.

The memory cell array 1 includes a plurality of memory blocks MB. Each of the memory blocks MB includes a plurality of memory transistors, that is, a plurality of charge accumulation type memory cells MC arranged three-dimensionally therein. The memory block MB is a minimum unit of an erase operation of data. Note that some of the plurality of memory blocks MB may be configured as a ROM fuse block 1a that stores initial setting data, trimming data, redundancy data for defect relief, and so on. Data of the ROM fuse block 1a is read after power activation of the present device, and the read data is transferred to and stored in the likes of the control unit 7.

The row decoders 2 and 3, during a write operation and a read operation of data of the memory cell array 1, decode a downloaded block address signal, and so on, and drive a certain word line, and so on. The sense amplifier 4 detects and amplifies an electrical signal flowing in a bit line during the read operation. The column decoder 5 decodes a column address signal and controls the sense amplifier 4. The source line potential setting unit 6 controls a potential of a source line SL. The control unit 7, as well as boosting a voltage and generating a high voltage employed during the write operation or the erase operation, generates a control signal and, along with controlling the row decoders 2 and 3, the sense amplifier 4, the column decoder 5, and the source line potential setting circuit 6, controls the memory cell array 1 via these.

Figure 2:
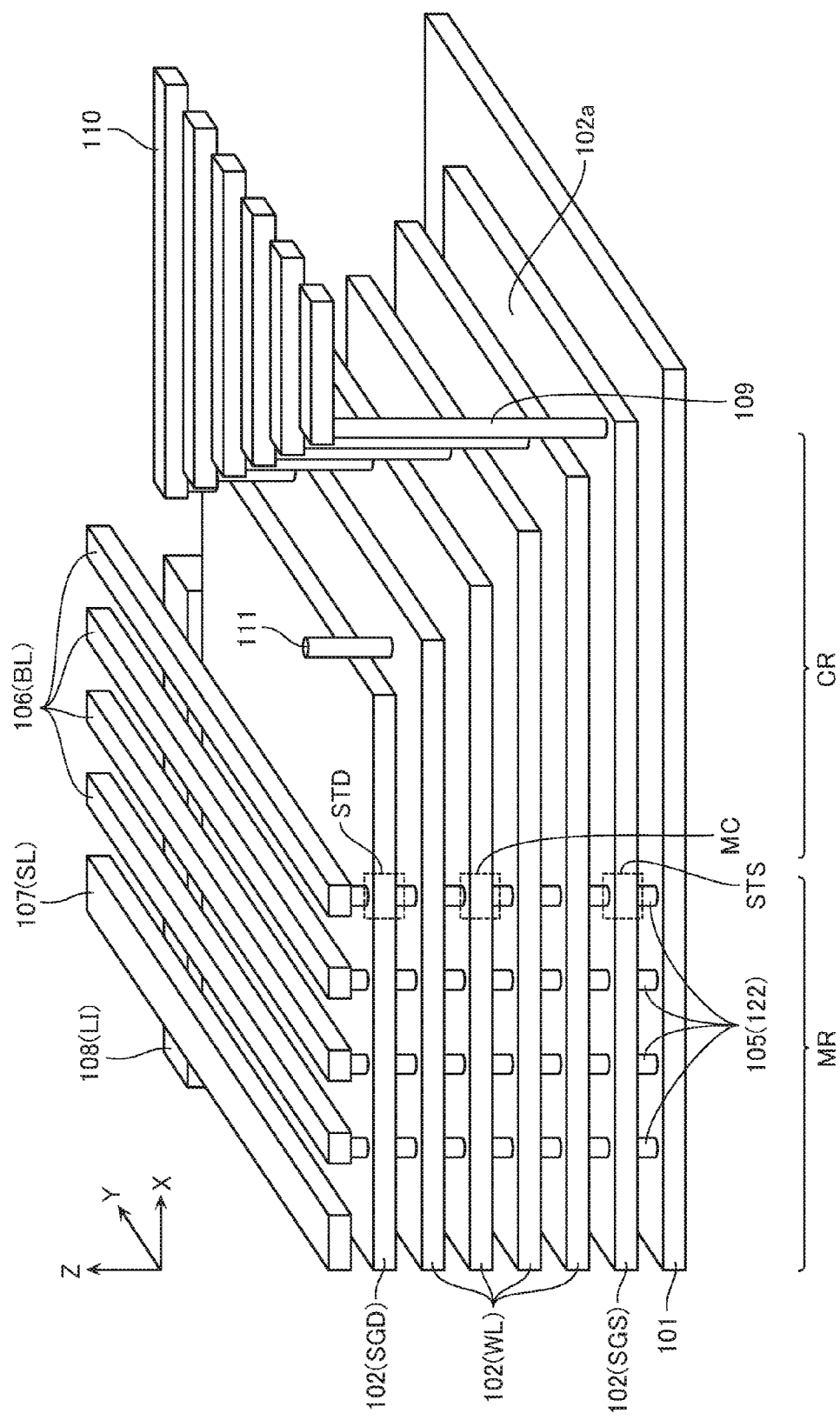
FIG. 2 is a schematic perspective view showing a configuration of part of a memory cell array of the semiconductor memory device according to the first embodiment.

Next, a schematic configuration of the memory cell array 1 according to the present embodiment will be described with reference to FIG. 2. FIG. 2 is a schematic perspective view showing a configuration of part of the memory cell array 1. Note that in FIG. 2, to simplify description, illustration of part of the configuration is omitted. Moreover, to simplify illustration, the numbers of each of wiring lines are also made different to those in the other drawings.

As shown in FIG. 2, the memory cell array 1 according to the first embodiment comprises: a substrate 101; and a plurality of conductive layers 102 stacked in a Z direction above the substrate 101. In addition, the memory cell array 1 includes a plurality of memory columnar bodies 105 extending in the Z direction. As shown in FIG. 2, an intersection of the conductive layer 102 and the memory columnar body 105 functions as a source side select transistor STS, the memory cell MC, or a drain side select transistor STD. The conductive layer 102 is configured from a conductive layer of the likes of tungsten (W) or polysilicon, for example, and functions as a word line WL, a source side select gate line SGS, and a drain side select gate line SGD.

As shown in FIG. 2, the plurality of conductive layers 102 comprise a wiring line portion formed in steps, at an end in an X direction. Hereafter, a region where the memory cells MC, and so on, are disposed will be referred to as a memory region MR, and a portion where the conductive layers 102 are drawn out from this memory region MR to form the conductive layers 102 in steps will be referred to as a stepped wiring line region CR.

An upper surface of an end of the conductive layer 102 in the stepped wiring line region CR includes a portion not covered by a conductive layer 102 positioned in a layer above, and that portion forms a contact portion 102a. The conductive layer 102 is connected to a lower end of a contact plug 109 at this contact portion 102a. Moreover, an upper end of the contact plug 109 is connected to a wiring line 110. The contact plug 109 and the wiring line 110 are configured from a conductive layer of the likes of tungsten.

Note that as shown in FIG. 2, the memory cell array 1 according to the first embodiment may comprise a plurality of supports 111 for inter-layer support during manufacturing. In FIG. 2, only one support 111 is representatively illustrated, but in the actual device, a greater number of supports 111 may be provided (refer to FIG. 5).

In addition, as shown in FIG. 2, the memory cell array 1 according to the first embodiment comprises a conductive layer 108 that faces side surfaces in a Y direction of the plurality of conductive layers 102 and extends in the X direction. A lower surface of the conductive layer 108 contacts the substrate 101. The conductive layer 108 is configured from a conductive layer of the likes of tungsten (W), for example, and functions as a source contact LI for connecting the source line SL and the substrate 101.

Note that a material of the conductive layer 102 is conceivably configured from a conductive layer of the likes of WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$, for example, besides the above-described tungsten (W) or polysilicon.

Moreover, as shown in FIG. 2, the memory cell array 1 according to the first embodiment comprises a plurality of conductive layers 106 and a conductive layer 107 that are positioned above the plurality of conductive layers 102 and the memory columnar body 105, are arranged in plurality in the X direction, and extend in the Y direction. The memory columnar bodies 105 are respectively electrically connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Figure 3:
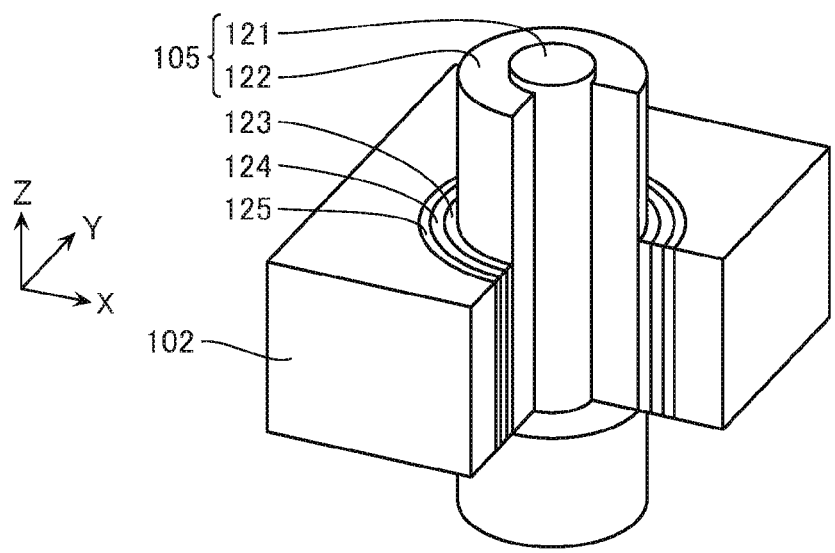
FIG. 3 is a schematic view showing a schematic configuration of a memory cell MC of the semiconductor memory device according to the first embodiment.

Next, a schematic configuration of the memory cell MC according to the first embodiment will be described with reference to FIG. 3. FIG. 3 is a schematic perspective view showing the configuration of the memory cell MC. Note that FIG. 3 shows the configuration of the memory cell MC, but the source side select transistor STS and the drain side select transistor STD may also be configured similarly to the memory cell MC. Moreover, in FIG. 3, part of the configuration is omitted.

As shown in FIG. 3, the memory cell MC is provided at an intersection of the conductive layer 102 and the memory columnar body 105. The memory columnar body 105 comprises: a core insulating layer 121; and a column-shaped semiconductor layer 122 that covers a sidewall of the core insulating layer 121. Furthermore, provided between the semiconductor layer 122 and the conductive layer 102 is a memory gate insulating film that includes a tunnel insulating layer 123, a charge accumulation layer 124, and a block insulating layer 125. The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC. The tunnel insulating layer 123 is configured from an insulating layer of the likes of silicon oxide ($SiO_2$), for example. The charge accumulation layer 124 is configured from an insulating film capable of trapping a charge in a trap site, of the likes of silicon nitride (SiN), for example. The block insulating layer 125 is configured from an insulating layer of the likes of silicon oxide ($SiO_2$), for example. A threshold voltage of the memory cell MC changes by an amount of charge accumulated to this charge accumulation layer 124. The memory cell MC stores data according to a value of this threshold voltage. In the write operation to the memory cell MC, a certain write voltage is applied to the word line WL (conductive layer 102), while the semiconductor layer 122 is applied with 0 V, for example. As a result, electrons are accumulated in the charge accumulation layer 124 and the threshold voltage of the memory cell MC rises. Conversely, in the erase operation of the memory cell MC, the word line WL is applied with 0 V, for example, while a certain erase voltage (for example, 20 V or more) is applied to the semiconductor layer 122 (channel). As a result, holes are injected into the charge accumulation layer 124 or conversely electrons are discharged from the charge accumulation layer 124, and so on, hence the threshold voltage of the memory cell MC lowers.

A material of the semiconductor layer 122 is conceivably configured from a semiconductor of the likes of SiGe, SiC, Ge, and C, for example, besides the above-described polysilicon. Moreover, a silicide may be formed at a contact surface of the semiconductor layer 122 with the substrate 101 or the conductive layer 106. Conceivably used in such a silicide are, for example, Sc, Ti, VCr, Mn, Fe, Co, Ni, Cu, Zn, Rh, Pd, Ag, Cd, In, Sn, La, Hf, Ta, W, Re, Os, Ir, Pt, Au, and so on. Furthermore, the following may be added to the silicide formed in this way, namely, Sc, Ti, VCr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, Au, and so on.

Employable as a material of the tunnel insulating layer 123 and the block insulating layer 125 are the likes of $SiO_2$, SiN, $Si_3N_4$, $Al_2O_3$, SiON, $HfO_2$, HfSiON, $Ta_2O_5$, $TiO_2$, or $SrTiO_3$.

Specifically, Si system insulating films of the likes of $SiO_2$, SiN, and SiON include ones in which concentrations of oxygen elements and nitrogen elements are each $1\times10^{18}$ atoms/$cm^3$ or more. However, barrier heights of multiple insulating layers differ from each other.

Figure 4:
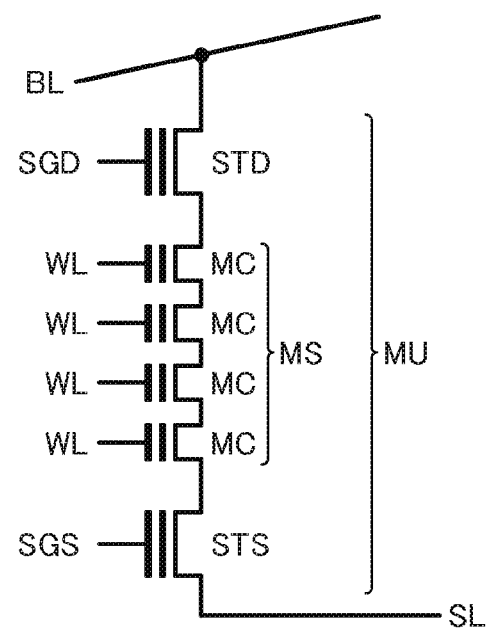
FIG. 4 is an equivalent circuit diagram of a memory unit MU of the semiconductor memory device according to the first embodiment.

The memory cell MC and the select transistors STD and STS having the above-mentioned structure are connected in series to configure a memory unit MU shown in FIG. 4. That is, the memory unit MU includes: a memory string MS configured from a plurality of the memory cells MC connected in series; and the source side select transistor STS and the drain side select transistor STD connected to both ends of the memory string MS. Note that it is also possible for some of the plurality of the memory cells MC in the memory string MS to be configured as dummy cells not employed in data storage. The number of dummy cells may be set to any number.

Figure 5:
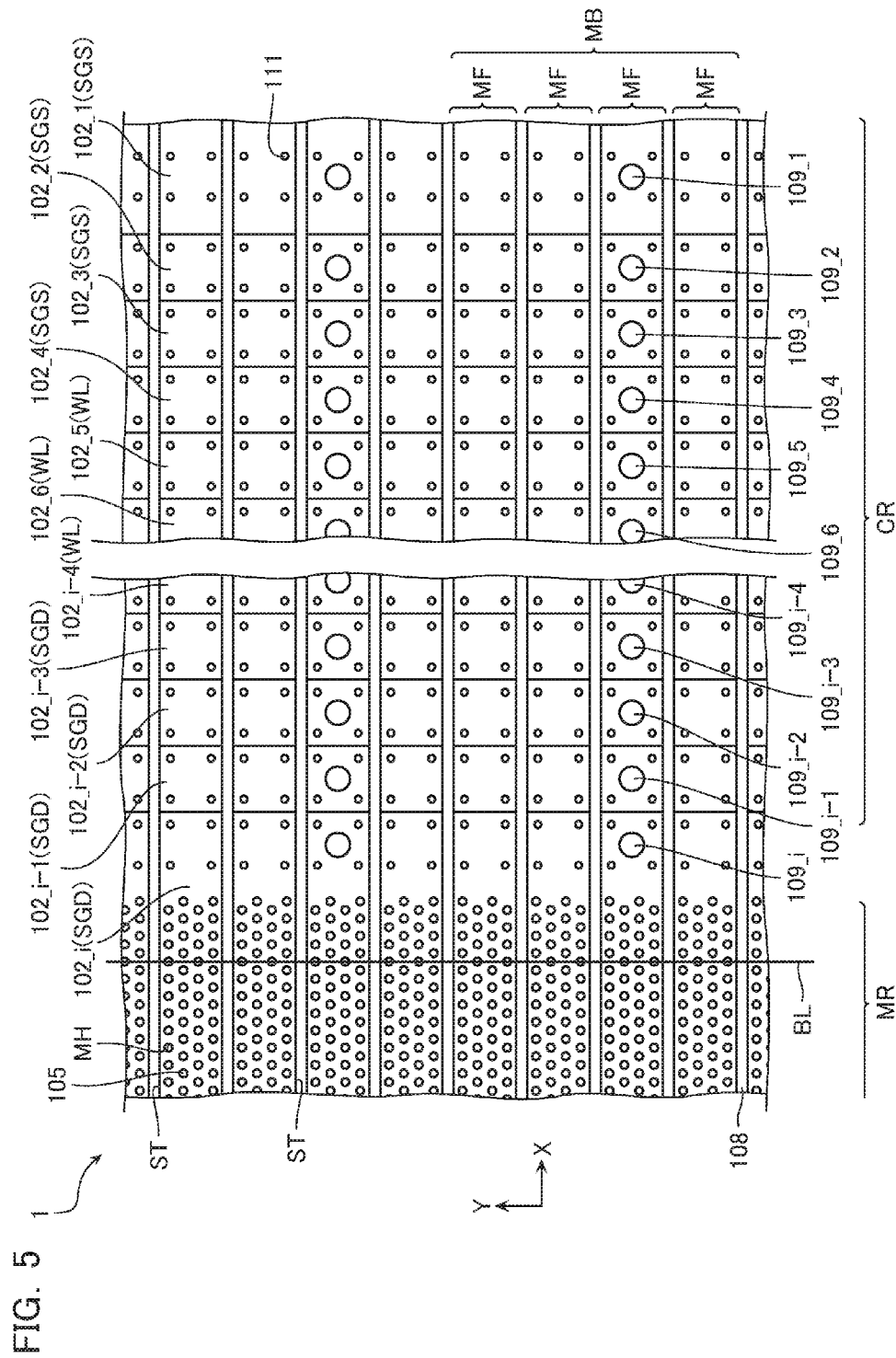
FIG. 5 is a plan view explaining details of configurations of a memory region MR and a stepped wiring line region CR of the semiconductor memory device according to the first embodiment.
Figure 6:
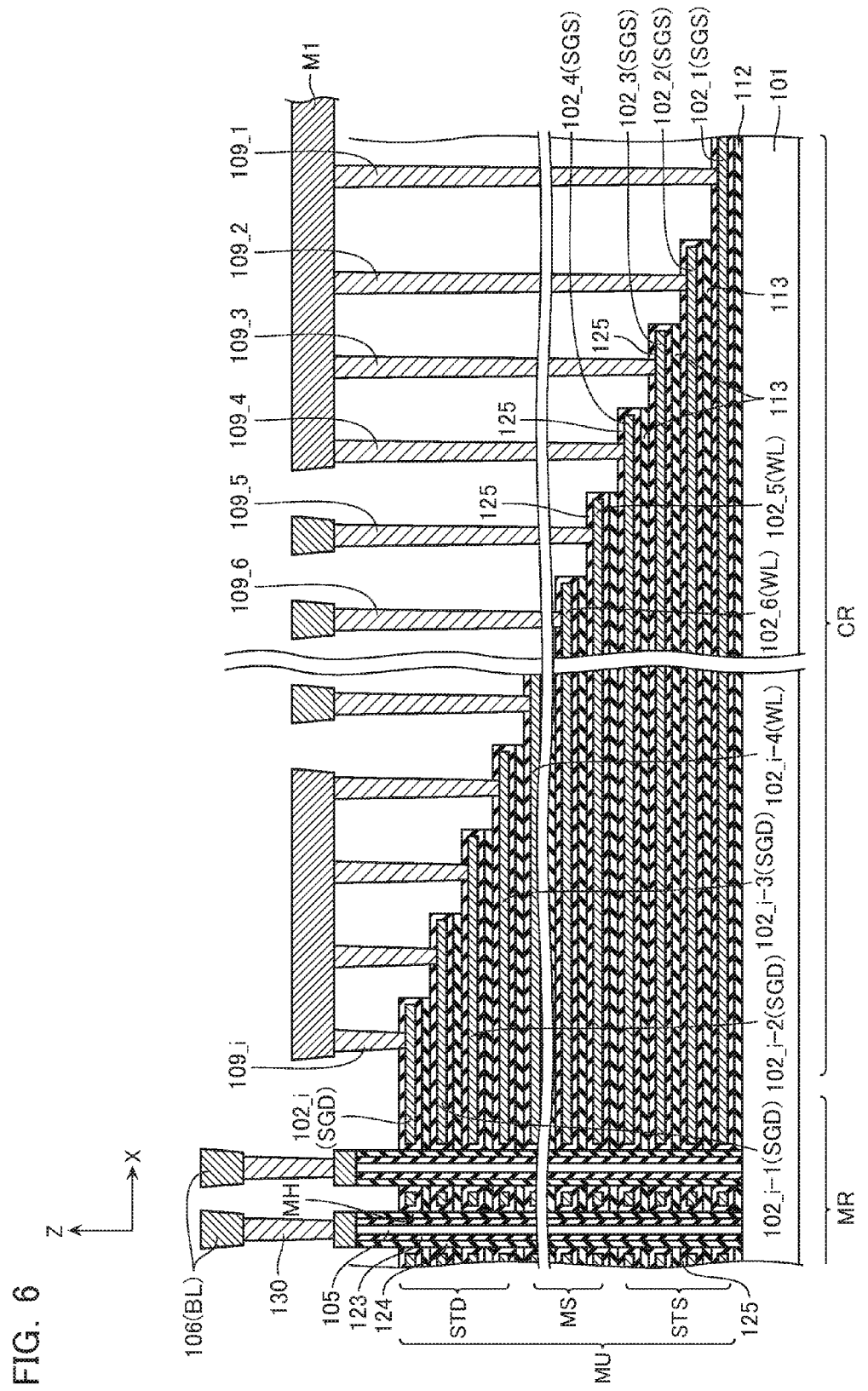
FIG. 6 is a cross-sectional view of the memory region MR and the stepped wiring line region CR along the XZ plane of FIG. 5.

Next, details of configurations of the memory region MR and the stepped wiring line region CR of the semiconductor memory device according to the first embodiment will be described with reference to FIGS. 5 and 6. FIG. 5 is a plan view showing the configurations of the memory region MR and the stepped wiring line region CR. Moreover, FIG. 6 is a cross-sectional view of the memory region MR and the stepped wiring line region CR along the XZ plane of FIG. 5. The numbers of word lines WL and select gate lines SGD and SGS are different from those of the schematic view of FIG. 2.

As shown in FIGS. 5 and 6, the memory cell array 1 according to the first embodiment comprises: the memory region MR where the memory unit MU is formed; and the stepped wiring line region CR extending from the memory region MR.

As shown in FIG. 6, in the memory region MR, a plurality (i) of the conductive layers 102 (102_1 to 102_$i$) are stacked on the substrate 101 via an inter-layer insulating film 112. The plurality of conductive layers 102 are stacked sandwiching an inter-layer insulating film 113.

Moreover, in the memory region MR, a large number of memory holes MH are formed so as to penetrate a stacked body of these conductive layers 102 and inter-layer insulating films 112 and 113. The previously mentioned memory columnar body 105 is formed inside this memory hole MH via the tunnel insulating layer 123 and the charge accumulation layer 124. The block insulating layer 125 is formed not inside the memory hole MH, but so as to cover a periphery of the conductive layers 102_1 to 102_$i$. That is, the memory columnar body 105 is formed such that its periphery is surrounded by the tunnel insulating layer 123 and the charge accumulation layer 124, a periphery of which is further surrounded by a stacked body of the conductive layers 102, the block insulating layer 125, and the inter-layer insulating films 112 and 113.

An upper end of the memory columnar body 105 is connected to the previously mentioned conductive layer 106 (bit line BL) via a contact wiring line 130, and so on.

Note that in the example illustrated in FIG. 5, the memory holes MH are provided in a staggered lattice shape in the XY plane. The bit lines BL are arranged, having the Y direction as their longitudinal direction, above the memory holes MH thus disposed in a staggered lattice shape. In FIG. 5, to simplify illustration, only one bit line BL is representatively illustrated. An arrangement in the XY directions of the memory holes MH is not limited to a staggered lattice shape, and the memory holes MH may also be disposed in a square lattice shape, for example.

The bit lines BL extending in the Y direction are arranged so as to straddle a plurality of the memory blocks MB. A region or unit in one memory block MB that includes therein a certain number of (in FIG. 5, four) arrays of the memory holes MH, the arrays extending in the X direction and arranged in the Y direction, is defined as a memory finger MF. The bit line BL is connected to only one memory columnar body 105 in each memory finger MF. Each memory finger MF includes an independent select gate line SGD, whereby only one memory string MS in the memory block MB can be read and adopted as a write target for every bit line BL.

As shown in FIG. 6, in the first embodiment, the conductive layers 102_1 to 102_4 function as the source side select gate line SGS and as a control gate electrode of the source side select transistor STS. That is, in this structure illustrated in FIG. 6, four source side select gate lines SGS are connected to one source side select transistor STS.

In addition, the conductive layers 102_5 to 102_$i$–4 function as the word lines WL and as control gate electrodes of the memory cells MC. That is, in this structure illustrated in FIG. 6, (i–8) memory cells MC are included in one memory string MS, and (i–8) word lines WL are connected to one memory string MS.

Moreover, the conductive layers 102_i–3 to 102_i function as the drain side select gate line SGD and as a control gate electrode of the drain side select transistor STD. That is, in this structure illustrated in FIG. 6, four drain side select gate lines SGD are connected to one drain side select transistor STD.

In addition, the stepped wiring line region CR has a structure in which the above-mentioned conductive layer 102 and inter-layer insulating film 113 are formed in steps. As a result of being formed in steps, each of the conductive layers 102 has an exposed portion not covered by the conductive layer 102 in the layer above it, and is configured to be connectable to the contact plug 109 (109_1 to 109_i) at this exposed portion. The contact plug 109 is connected at its upper end to an upper layer wiring line M1 (corresponding to the wiring line 110 of FIG. 2).

Moreover, formed in the memory region MR and the stepped wiring line region CR are a large number of slits ST that extend having the X direction as their longitudinal direction. The slit ST is implanted with an insulating film (not illustrated) or is implanted with the previously mentioned source contact LI, via an insulating film (not illustrated). That is, the insulating film (not illustrated), by being implanted in the slit ST, plays a role of electrically insulating and isolating the conductive layers 102 positioned on both sides thereof.

As shown in FIG. 5, the slit ST extends having the X direction as its longitudinal direction, and is formed so as to divide the stacked body of the conductive layers 102 and inter-layer insulating films 112 and 113 from an upper surface to a bottom of the stacked body. As a result, the slit ST divides the conductive layers 102_1 to 102_i of the memory region MR and the stacked wiring line region CR in the Y direction.

In FIG. 5, although illustration thereof is omitted, it is possible to configure such that the slit ST is implanted with the previously mentioned conductive layer 108 (source contact LI), via the insulating film. Moreover, in FIG. 5, all of the select gate lines SGD, word lines WL, and select gate lines SGS are divided on a memory finger MF basis, by the slit ST. However, the slit ST dividing on a memory finger MF basis need only be formed in at least the select gate lines SGD, and the word lines WL and select gate lines SGS may be divided on a memory block MB basis.

Next, the erase operation in the semiconductor memory device having such a configuration and a problem at a time of the erase operation, will be described with reference to FIGS. 7 to 9.

Figure 7:
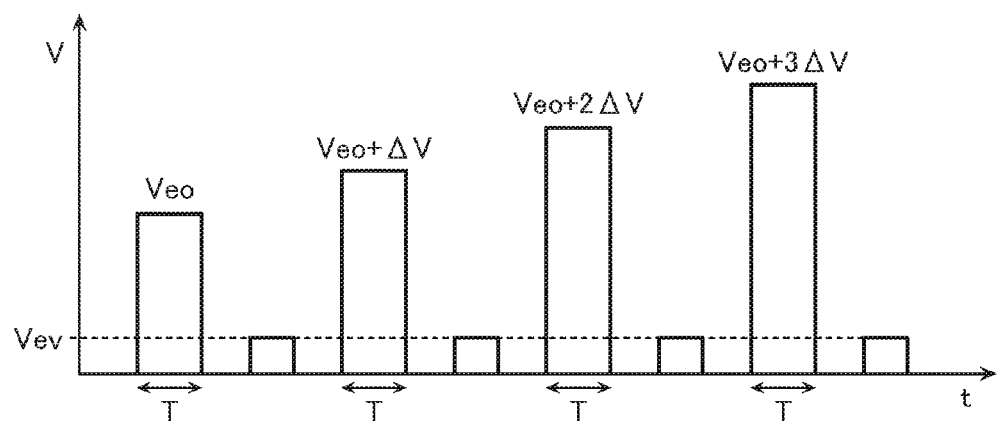
FIG. 7 is a waveform chart showing an applied voltage to the memory cell MC in a general erase operation.
Figure 8:
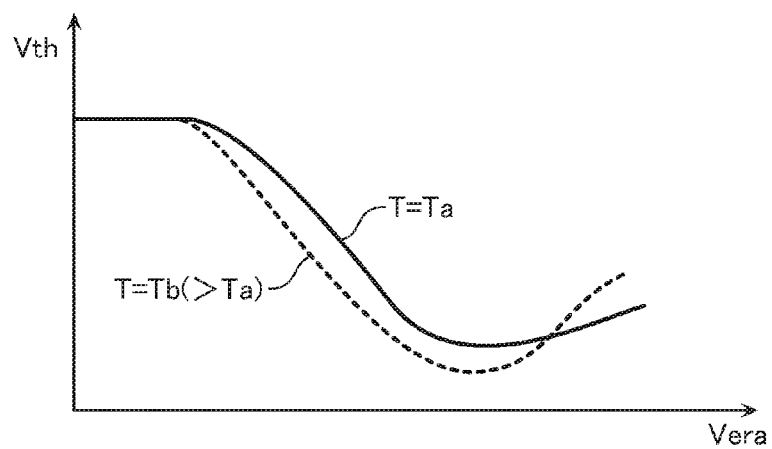
FIGS. 8 and 9 are a graph and a conceptual diagram showing a problem of the general erase operation such as in FIG. 7.

FIG. 7 is a waveform chart showing an applied voltage to the memory cell MC in a general erase operation. FIGS. 8 and 9 are a graph and a conceptual diagram showing a problem in such an erase operation.

As previously mentioned, in the erase operation, the semiconductor layer 122 is applied with an erase voltage Vera (for example, 20 V or more) via the source line SL, while the conductive layer 102 which is the word line WL (control gate electrode) is applied with a smaller voltage than this erase voltage Vera, for example, 0 V. As a result, electrons are discharged from the charge accumulation layer 124 or holes are injected into the charge accumulation layer 124, hence a threshold voltage Vth of the memory cell MC lowers. Note that instead of applying the erase voltage Vera to the semiconductor layer 122 via the source line SL, the erase voltage Vera may be applied to the substrate 101 or a well formed in the substrate 101. Moreover, it is possible that the erase voltage Vera is provided to the bit line BL to raise a channel potential of the semiconductor layer 122 to the erase voltage Vera by a hole current of GIDL (Gate Induced Drain Leakage) caused in a channel portion of the drain side select transistor STD.

As shown in FIG. 7, the erase voltage Vera is applied as a pulse voltage having a pulse width T of about 1 to 2 mS, for example. Moreover, although the erase voltage Vera is set to an initial value Veo in a first time of an application operation, subsequently, its voltage value rises gradually by a step-up operation, based on a result of an erase verify operation.

After such an erase pulse application operation, in order to confirm whether an erase target memory cell has reached a desired threshold voltage or not, the erase verify operation, which is a read operation targeting the erase target memory cell, is performed. In this erase verify operation, similarly to in an ordinary read operation, the bit line BL is pre-charged to a certain potential, and then the word line WL is applied with an erase verify voltage Vev, whereby a cell current flowing in the semiconductor layer 122 is read. If a cell current flows, it is determined that the threshold voltage of the memory cell MC has reached the desired threshold voltage (erase state) (pass), and if a cell current does not flow, it is determined that the desired threshold voltage has not been reached (fail). In the case that the desired threshold voltage has not been reached, the erase voltage Vera applied next time is raised to an extent of a step-up value ΔV, for example, by the previously mentioned step-up operation (Vera=Veo+ΔV).

In such an erase operation, if the pulse width T of the erase voltage Vera is made long, the threshold voltage Vth of the memory cell MC may rise, conversely, in an advanced stage of the erase operation. For example, as shown in FIG. 8, the following phenomenon has been seen, that is, the phenomenon that as the erase operation proceeds and the value of the erase voltage Vera gradually rises by the step-up operation, when the erase voltage Vera has reached a certain value, the threshold voltage Vth of the memory cell MC saturates (degree of lowering decreases), and furthermore regardless of the erase voltage Vera rising, the threshold voltage Vth does not lower, rather ends up rising. Moreover, it has become clear that this phenomenon becomes more prominent as the pulse width T of the erase voltage Vera becomes larger. That is, when the pulse width T is Tb (>Ta), a change in the threshold voltage Vth (inclination ΔVth/ΔVera) when the erase voltage Vera is small is larger compared to when the pulse width T is Ta. However, when the erase voltage Vera has exceeded a certain value, the threshold voltage Vth saturates and ends up changing to rise. Moreover, a degree of that rise is prominent when the pulse width T is large (in the case of FIG. 8, a rise degree of the threshold voltage Vth is larger when T=Tb than when T=Ta).

Figure 9:
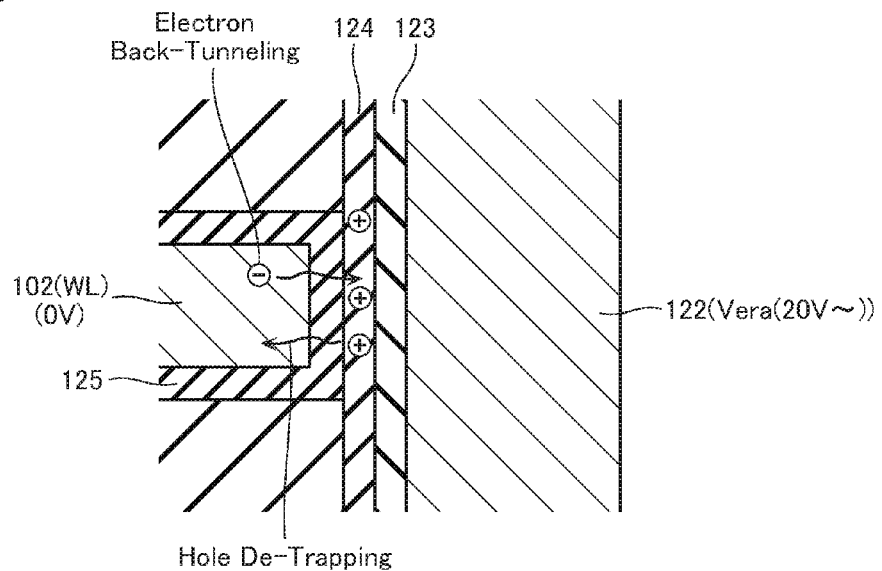

As illustrated in FIG. 9, such a phenomenon conceivably occurs due to withdrawal (de-trapping) of holes from the charge accumulation layer 124 to the conductive layer 102 (word line WL) and back-tunneling of electrons from the conductive layer 102 to the charge accumulation layer 124. That is, during the erase operation, a potential difference between the erase voltage Vera applied to the semiconductor layer 122 and a voltage applied to the word line WL (for example, 0 V) results in electrons being emitted from the charge accumulation layer 124 to the semiconductor layer 122 or holes being injected into the charge accumulation layer 124 whereby the threshold voltage Vth lowers. In contrast, it is also the case that, as the erase operation proceeds and the change in the threshold voltage Vth decreases (as saturation is reached), such a large potential difference causes the above-mentioned hole de-trapping or electron back-tunneling, and this contrarily ends up raising the threshold voltage Vth. Note that such hole de-trapping or electron back-tunneling can be improved by increasing a thickness of the block insulating film in the memory gate insulating film. However, there is a problem that increasing the thickness of the block insulating film ends up lengthening an erase time.

Thus, particularly in the erase operation in a charge trap type semiconductor memory device that stores data in the memory cell MC by trapping a charge in a trap site in an insulating film, it has been difficult to prevent a rise in the threshold voltage Vth when the erase voltage Vera has saturated due to hole de-trapping or electron back-tunneling.

In the semiconductor memory device of the present embodiment, this problem is solved by adopting in the erase operation a voltage application method of the next described type. Note that the following operation can be controlled by the control unit 7 of FIG. 1.

That is, in the present embodiment, control is performed such that, when the erase operation has advanced to a certain stage, the voltage value of the erase voltage Vera increases by the step-up operation, but the pulse width is shortened. In other words, the semiconductor memory device of the present embodiment, compared to when the erase operation is in a first stage, increases the voltage value and shortens the pulse width of the erase voltage when the erase operation is in a second stage later than the first stage.

Figure 10:
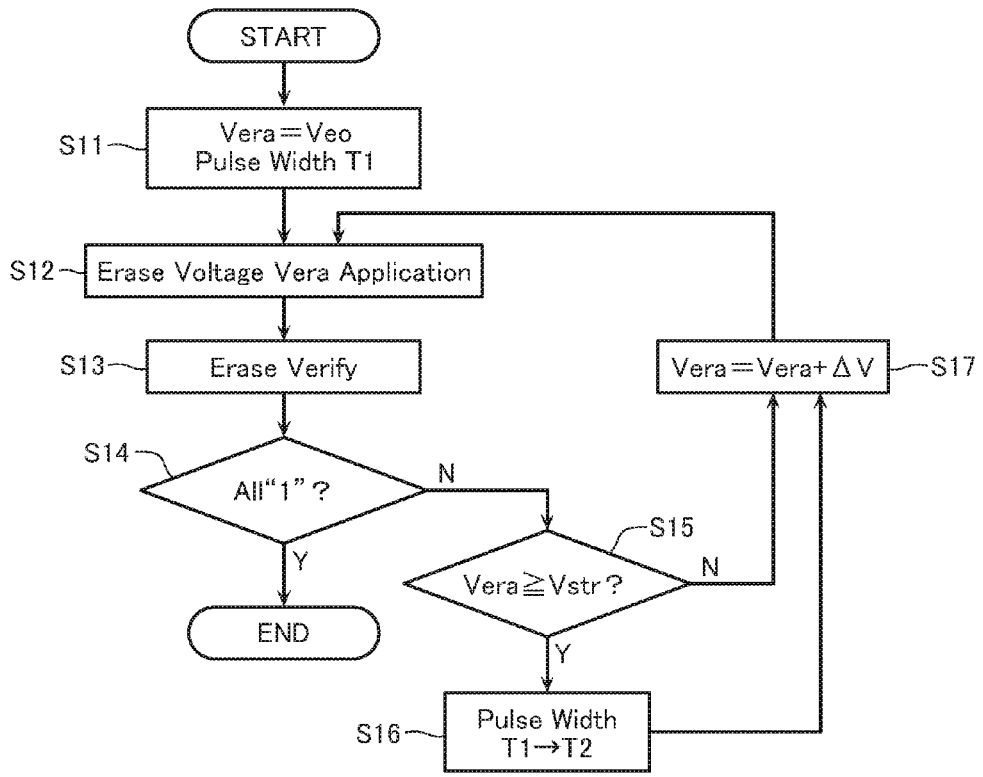
FIG. 10 is a flowchart showing a procedure of an erase operation in the first embodiment.
Figure 11A:
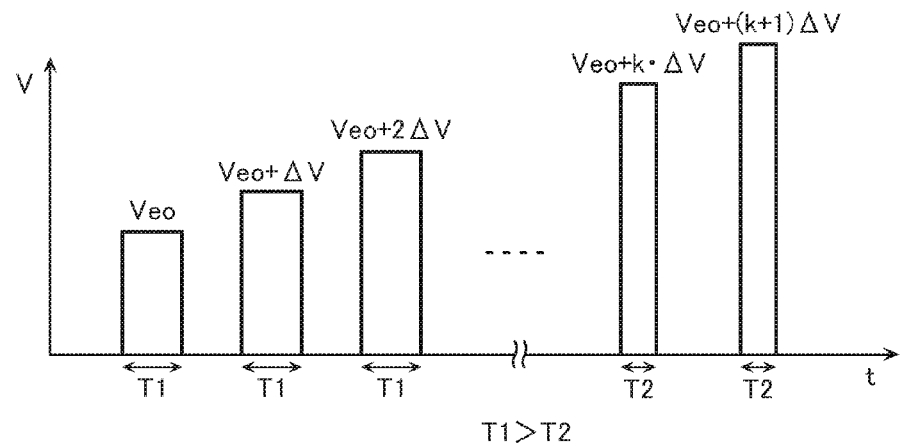
FIG. 11A is a waveform chart showing one example of a voltage waveform of an erase voltage Vera in the case of following the procedure of FIG. 10.
Figure 12:
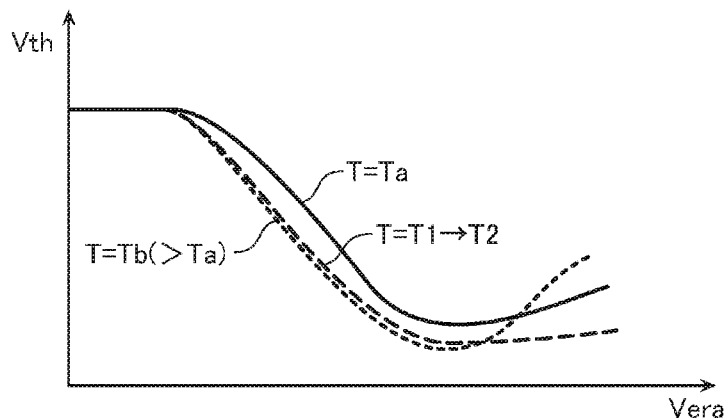
FIG. 12 is a graph showing an advantage of the erase operation of the first embodiment.

FIG. 10 is a flowchart showing a procedure of the erase operation in the first embodiment; FIG. 11A shows one example of a voltage waveform of the erase voltage Vera in the case of following this procedure; and FIG. 12 shows an advantage of the erase operation in the first embodiment.

In the erase operation of the present embodiment, first, along with the value of the erase voltage Vera being set to the initial value Veo, the pulse width T (time held at Veo) is set to T1 (S11), and the initial erase voltage Vera is applied to an erase target memory block MB as a pulse voltage of pulse width T=T1 (S12).

Subsequently, the erase verify operation is executed (S13). In the erase verify operation, one of the plurality of memory fingers MF included in the memory block MB adopted as the erase target is selected, and data is read, via the bit lines BL, from all of the memory strings MS in that selected memory finger MF. This is repeated for all of the memory fingers MF of the erase target memory block MB. Then, it is determined whether all of the memory cells MC of the memory block MB are in an erase state (All "1") or not, specifically whether the threshold voltages Vth of all of the memory cells MC included in the memory block MB have reached a target value or not (S14). In the case that the threshold voltages Vth of all of the memory cells MC have reached the target value ('Y' of S14), the erase operation ends. On the other hand, if it is determined that the threshold voltage Vth has not reached the target value ('N' of S14), the erase operation shifts to step S15.

In step S15, it is determined whether the erase voltage Vera has reached a reference voltage Vstr or not. If the reference voltage Vstr has not been reached, the erase voltage Vera is subjected to the step-up operation. That is, the erase voltage Vera is raised to an extent of a step-up value ΔV compared to the voltage value immediately before (S17). This post-step-up erase voltage Vera is used in the next erase pulse application operation (S12). In the next erase pulse application, the pulse width T of the pulse form erase voltage Vera is not substantively changed (a time held at a substantially constant voltage is not changed). However in proportion to a greater time being spent for rise to the stepped-up constant voltage, a time from the start of the voltage rise to the end of the voltage drop may differ from that of the erase voltage Vera before the step-up, and a similar operation is allowable also in the second stage or other embodiments described below.

In this way, the above-described procedure is repeated until the threshold voltage Vth reaches the target value in the erase verify operation (S13). However, in the case that due to the step-up operation, the erase voltage Vera (=Veo+ k·ΔV) has become the reference voltage Vstr or more, the erase operation is determined to have shifted from the first stage to the second stage, and the pulse width T (time held at a substantially constant voltage) of the erase voltage Vera is switched from its original value T1 to a value T2 which is smaller than T1 (S16). The pulse width T of the erase voltage Vera thereafter is set to this post-switching value T2. Note that the values of T1 and T2 are not limited to specific values, but as an example, when T1 is 2 mS, T2 may be set to about 0.1 to 0.5 mS.

Figure 11B:
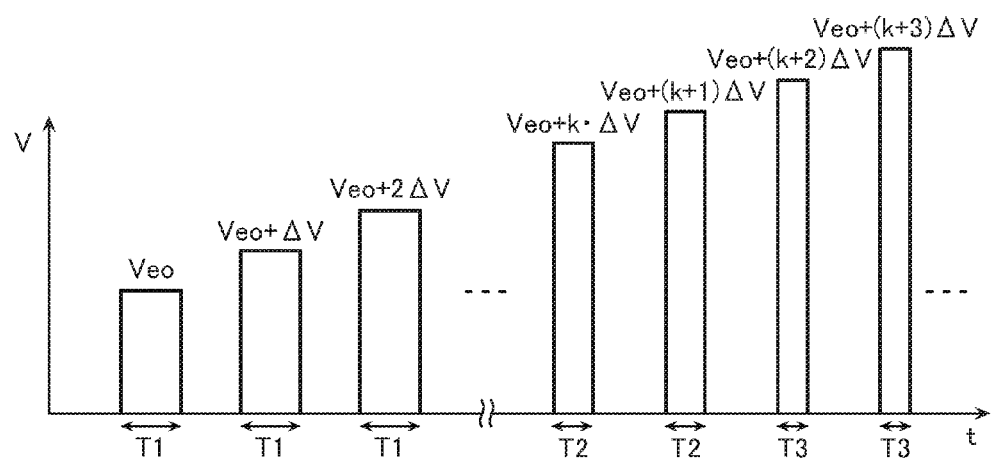
FIG. 11B is a waveform chart showing another example of a voltage waveform of the erase voltage Vera of the first embodiment.

Note that FIG. 11A shows an example where the pulse width T of the erase voltage Vera is changed from T1 to T2 in one stage only. However, the present embodiment is not limited to this, and as shown in FIG. 11B, the pulse width T may be changed twice, from T1 to T2, then further to T3, and furthermore, although illustration thereof is omitted, it is also possible for the pulse width T to be changed in multiple stages over three or more stages.

Thus, in the present embodiment, the pulse width T of the erase voltage Vera is switched from a first value T1 to a second value T2 (<T1), bounded by a time point when the erase voltage Vera has become the reference voltage Vstr or more by the step-up operation. As a result of changing the pulse width T of the erase voltage Vera in this way, in the first half of the erase operation, change of the threshold voltage Vth can be speeded up, while in the second half of the erase operation, the erase operation can be advanced while the hole de-trapping or electron back-tunneling explained by FIG. 9 are prevented by a short pulse voltage. That is, it can be avoided that when the threshold voltage Vth has saturated, the threshold voltage Vth conversely ends up rising. Therefore, this embodiment makes it possible to execute an erase operation that, while speeding up an erase speed, avoids a situation where when the threshold voltage Vth has saturated, the threshold voltage Vth does not lower, rather rises (refer to FIG. 12). Note that this reference voltage Vstr may be determined based on a simulation or a test result of an actual device, and so on.

Modified Example of First Embodiment

Figure 13:
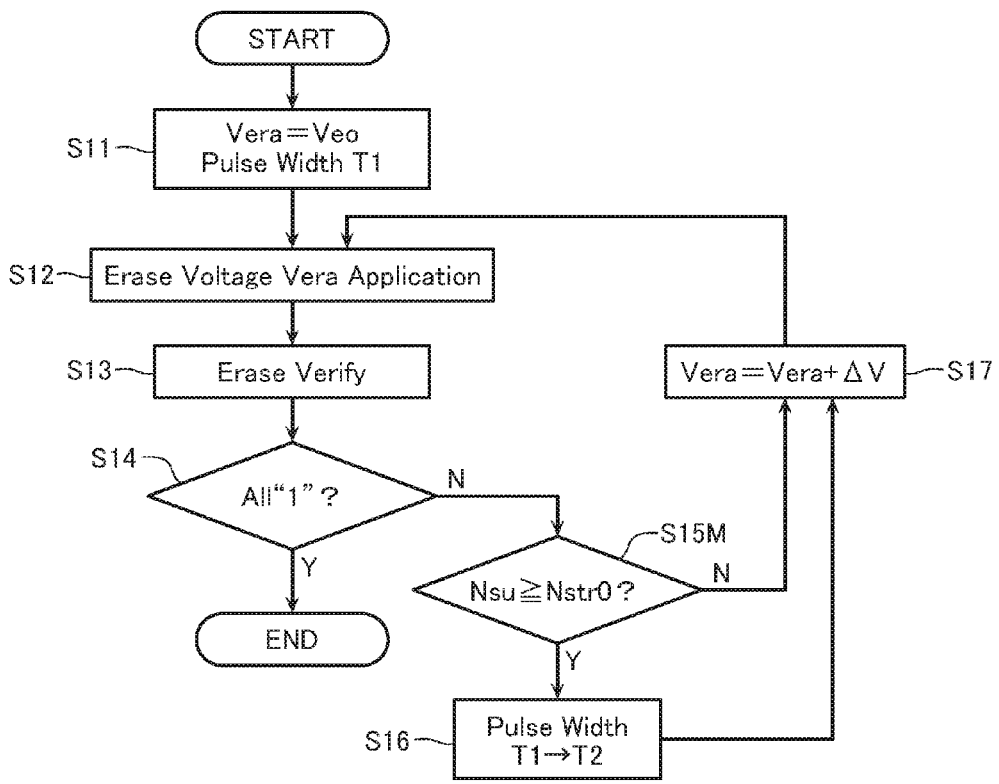
FIG. 13 is a flowchart showing a procedure of an erase operation according to a modified example of the first embodiment.

FIG. 13 is a flowchart according to a modified example of the first embodiment. In the above-described first embodiment, in step S15, it was determined whether the erase voltage Vera has become the reference voltage Vstr or more, or not. Instead, in this modified example, in step S15M in place of step S15, the number of times of step-ups Nsu of the erase voltage Vera (number of times of executions of step S17) is counted to determine whether that count value Nsu has become a certain value Nstr0 or more, or not. An increase in the number of times of step-ups corresponds to an increase in the erase voltage Vera, hence similar advantages to those of the above-described first embodiment can be displayed also by this modified example. Note that a similar change is possible also in another embodiment described below.

Second Embodiment

Next, a semiconductor memory device according to a second embodiment will be described with reference to FIGS. 14 and 15. An overall configuration of the semiconductor memory device of this second embodiment is substantially identical to that of the first embodiment, hence duplicated description thereof will be omitted below.

This second embodiment differs from the first embodiment in details of the erase operation.

Figure 14:
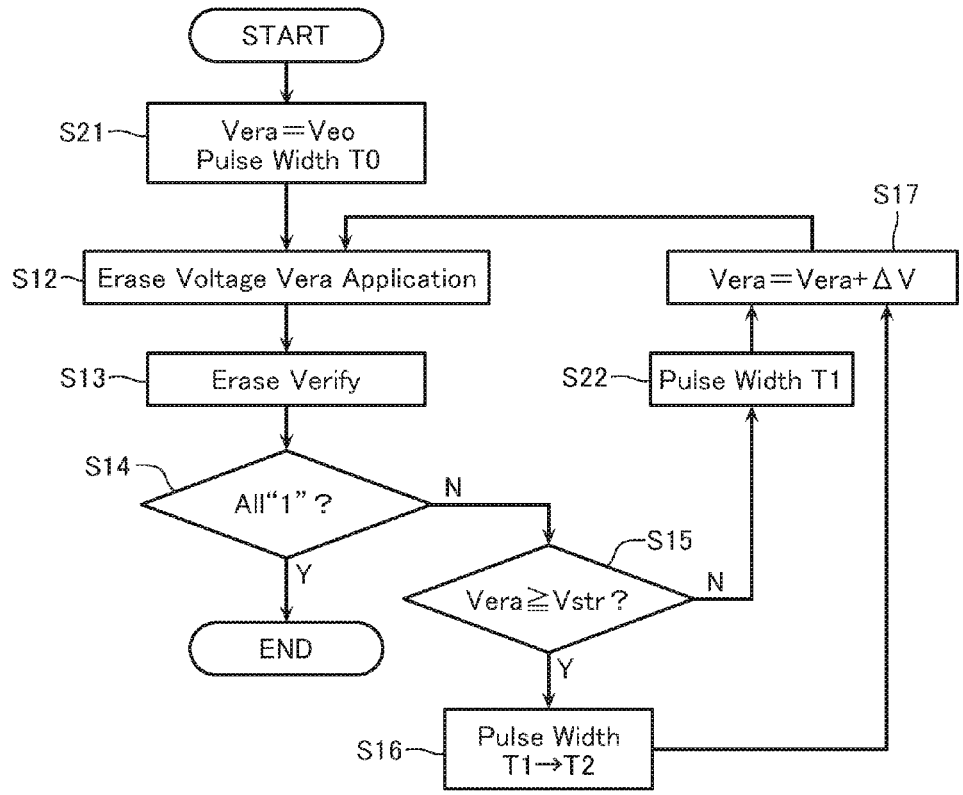
FIG. 14 is a flowchart showing a procedure of an erase operation according to a second embodiment.
Figure 15:
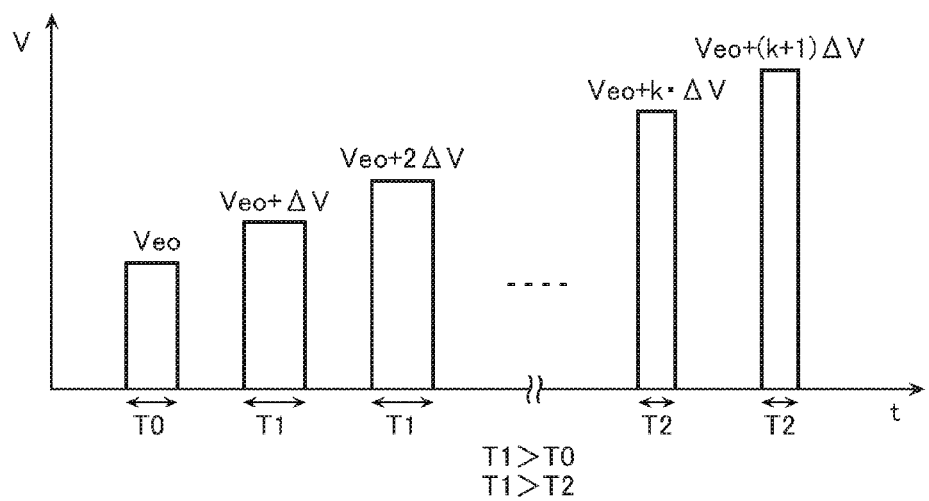
FIG. 15 is a waveform chart showing one example of a voltage waveform of an erase voltage Vera in the case of following the procedure of FIG. 14.

FIG. 14 is a flowchart showing a procedure of the erase operation in the second embodiment; and FIG. 15 shows one example of a voltage waveform of the erase voltage Vera in the case of following this procedure.

In the erase operation of this second embodiment, the pulse width T of the erase voltage Vera in an initial stage of the erase operation, for example, a stage where a very first one of the erase voltages Vera is applied, is set to T0 (<T1) which is smaller than the previously mentioned T1 (S21), and this differs from the first embodiment. In other respects, the erase operation of this second embodiment is similar to that of the first embodiment, and in FIG. 14, identical steps are assigned with identical step numbers to those assigned in FIG. 10. Therefore, duplicated description will be omitted below. Regarding the waveform of the erase voltage Vera, as shown in FIG. 15, only the pulse width T of the very first applied erase voltage Vera (voltage value Veo) is T0, and in a second time onward, the pulse width T is set to T1 (S22). Subsequently, similarly to in the first embodiment, the pulse width T is switched from T1 to T2, bounded by a time point when the erase voltage Vera has exceeded the reference voltage Vstr (S16).

Note that the pulse voltage provided with the small pulse width T0 is not limited to the very first one, and two or more of the pulse voltages may be provided with the small pulse width T0.

Similar advantages to those of the first embodiment can be displayed also by this second embodiment. In addition, in the second embodiment, an erase voltage Vera of small pulse width T is applied in a first time of the erase operation, hence excessive erase in the memory cell MC can be avoided and stress on the memory gate insulating film can be relieved and prolonged life of the memory cell achieved.

Third Embodiment

Next, a semiconductor memory device according to a third embodiment will be described with reference to FIG. 16. An overall configuration of the semiconductor memory device of this third embodiment is substantially identical to that of the first embodiment, hence duplicated description thereof will be omitted below.

This third embodiment differs from the first embodiment in details of the erase operation.

Figure 16:
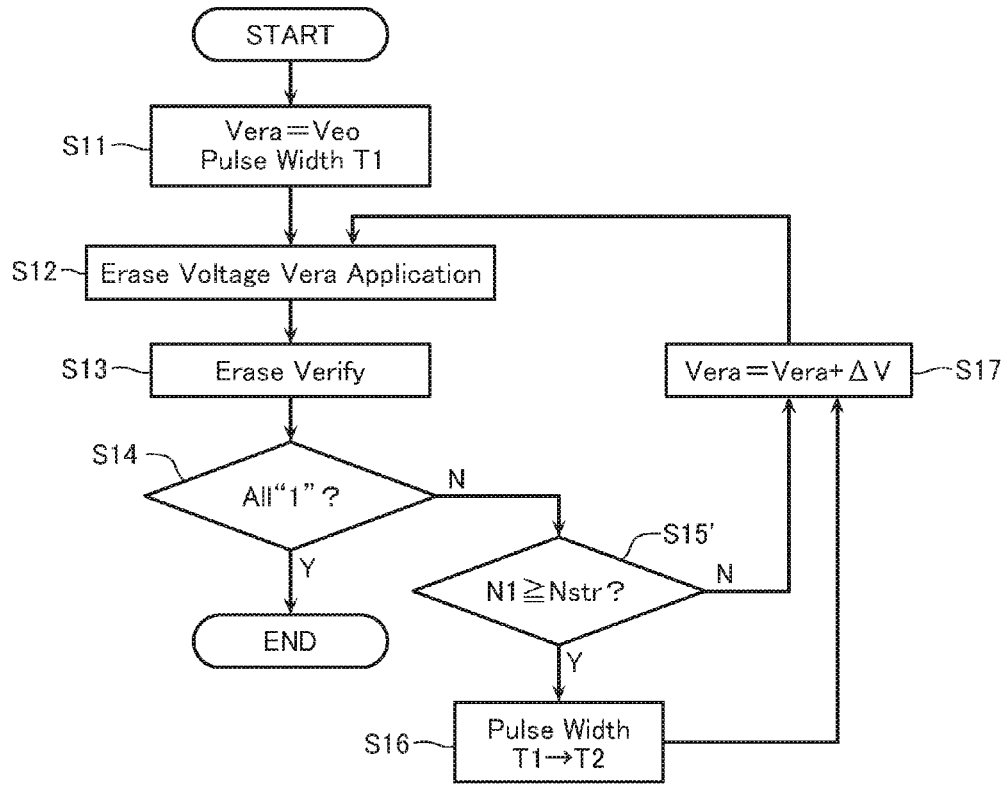
FIG. 16 is a flowchart showing a procedure of an erase operation according to a third embodiment.

FIG. 16 is a flowchart showing a procedure of the erase operation in the third embodiment. The procedure of the erase operation of this embodiment is similar to the procedure of the first embodiment (FIG. 10) excluding the following point, and in FIG. 16, similar steps are assigned with identical numbers.

However, in this embodiment, a procedure performed in the case that the erase operation was not completed ('N' of S14) in the erase verify operation (S13), is different. The first embodiment determines whether to change the pulse width T by judging whether the erase voltage Vera has reached the reference voltage Vstr or not. In contrast, the third embodiment determines, among the plurality of the memory strings MS, whether the number N1 of the memory strings MS for which the erase operation has been determined to have been completed is not less than a reference value Nstr (S15'). When this number N1 is the reference value Nstr or more, it indicates that the erase operation has advanced to a considerable degree, and consequently there is a high possibility that the threshold voltage Vth of the memory cell MC is approaching a saturation state. Therefore, in the erase verify (S13), a pass/fail flag of each of the memory strings MS for each of the sequentially selected memory fingers MF is subject to latch, and after the erase verify operation on all of the memory fingers MF included in the erase target memory block MB has been performed, the number of memory strings MS in the memory block MB that have passed the erase verify operation is counted based on the latched flags. In the present embodiment, if it is determined that N1=>Nstr, then the pulse width T of the erase voltage Vera is changed from T1 to T2. Similar advantages to those of the first embodiment can be displayed also by this procedure.

Note that although illustration thereof is omitted, determination similar to that of step S15' may be performed in the procedure of the erase operation of the second embodiment.

Fourth Embodiment

Figure 17:
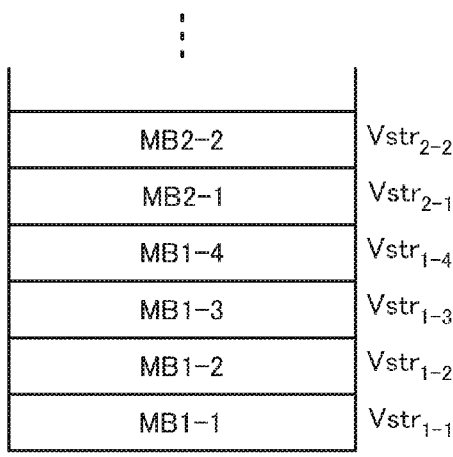
FIG. 17 is a conceptual diagram explaining a fourth embodiment.

Next, a semiconductor memory device according to a fourth embodiment will be described with reference to FIG. 17. An overall configuration of the semiconductor memory device of this fourth embodiment is substantially identical to those of the previously mentioned embodiments, hence duplicated description thereof will be omitted below. Moreover, a procedure of the erase operation may also be similar to those of the previously mentioned embodiments.

However, in this embodiment, the reference voltage Vstr employed in step S15 of FIG. 10 is set to a different value ($Vstr_{1-1}$, $Vstr_{1-2}$, $Vstr_{1-3}$, ...) for each of the memory blocks MB (MB1-1, MB1-2, MB2-2, ...) which are a minimum unit of the erase operation, and this differs from the previously mentioned embodiments. Such reference voltages Vstr differing for each of the memory blocks MB are, for example, stored in the ROM fuse 1a, read from the ROM fuse 1a by an initial setting operation during power activation, and stored in an unillustrated storage unit in the control unit 7. The control unit 7 reads a corresponding reference voltage Vstr based on a position of the memory block MB which is a target of the erase verify operation, and executes the above-mentioned control of the erase operation.

Due to this embodiment, a different reference voltage Vstr is settable for each memory block MB, hence even more reduction in erase time can be achieved than in the first embodiment, and it is possible to avoid a situation that when the threshold voltage Vth of the memory cell MC has saturated, the threshold voltage Vth conversely ends up rising.

Note that the above-described example explained the case of setting a different reference voltage Vstr for each memory block MB, but there is no need for a different reference voltage Vstr to be set for each memory block MB, and it can be adopted that the reference voltages Vstr are set freely for a plurality of regions in the memory cell array 1. For example, an identical reference voltage Vstr may be set for several of the memory blocks MB. In other words, in the case where there are a plurality of memory blocks MB, at least two or more of the reference voltages Vstr are configured settable. Moreover, the minimum unit of the erase operation is not limited to the memory block MB, and in a device in which the minimum unit of the erase operation may be changed to a region smaller than the memory block MB, a different reference voltage Vstr may be set for each of those regions. Furthermore, the number of times of step-ups Nsu shown in step S15M of FIG. 13 may have a different reference value set for each region.

Fifth Embodiment

Next, a semiconductor memory device according to a fifth embodiment will be described with reference to FIG. 18. An overall configuration of the semiconductor memory device of this fifth embodiment is substantially identical to that of the first embodiment, hence duplicated description thereof will be omitted below.

This fifth embodiment differs from the first embodiment in details of the erase operation.

Figure 18:
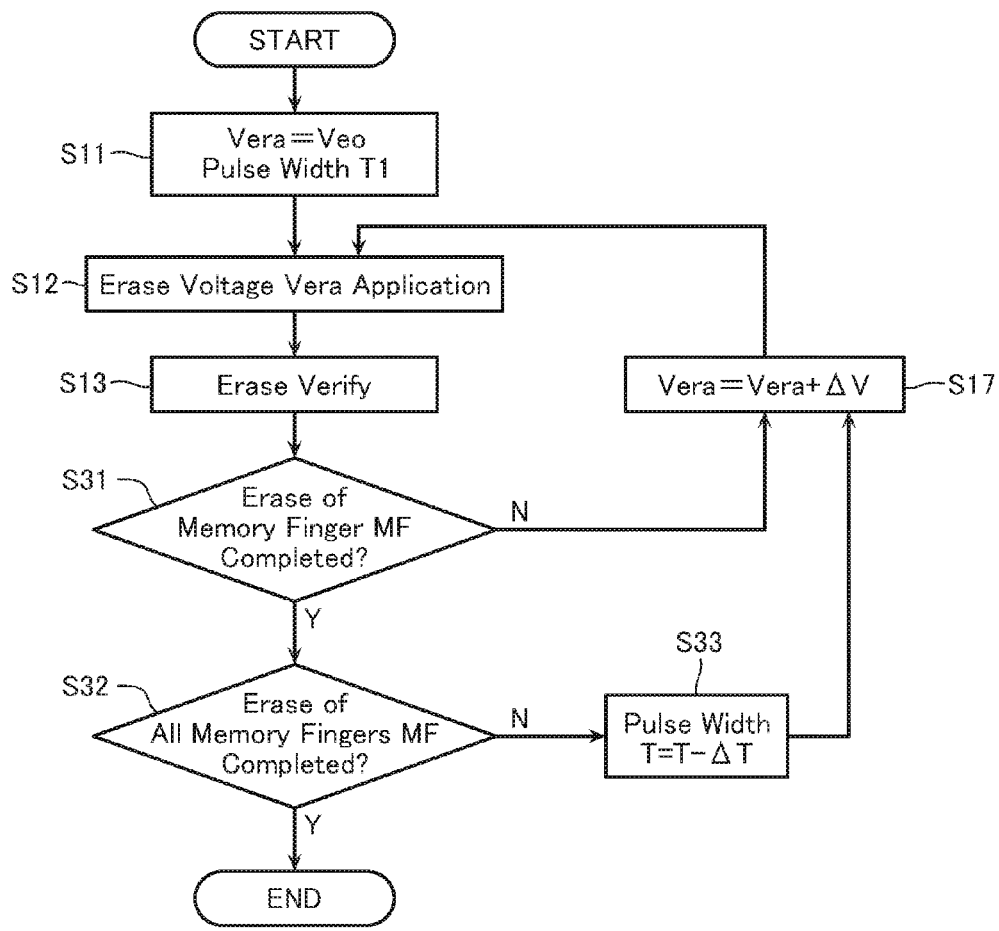
FIG. 18 is a flowchart showing a procedure of an erase operation according to a fifth embodiment.

FIG. 18 is a flowchart showing a procedure of the erase operation of the semiconductor memory device according to the fifth embodiment. Of each of steps of the flowchart of FIG. 18, steps S11 to S13, and step S17 are identical to in the first embodiment (FIG. 10), hence duplicated description thereof will be omitted.

In this fifth embodiment, the pulse width T of the erase pulse is shortened every time erase of the memory finger MF included in the memory block MB to be erased finishes. That is, in this fifth embodiment, when it is confirmed that an erase operation is completed in each of the memory fingers MF, which are one example of a region smaller than the memory block MB which is the minimum unit of the erase operation, control that shortens the pulse width T of the erase voltage Vera is performed.

Specifically speaking, a result of the erase verify (S13) is stored for each of the memory fingers MF. Then, when there is no new memory finger MF in which erase of all of the memory strings MS has been completed ('N' of S31), the erase voltage Vera is stepped up to repeat the next operation without any change to the pulse width T (S17). However, when it is confirmed that there is a new memory finger MF for which erase has been completed ('Y' of S31), and as far as erase of all of the memory fingers MF has not been completed ('N' of S32), the pulse width T of the erase pulse is shortened to an extent of ΔT (S33). When erase of all of the memory fingers MF has been completed ('Y' of S32), the erase operation ends.

The operation of this fifth embodiment results in the pulse width T of the erase voltage Vera decreasing to an extent of ΔT every time there is an increase in the number of memory fingers MF for which erase of all of the memory strings MS has been completed. As a result, similar advantages to those of the previously mentioned embodiments can be displayed.

As previously mentioned, the memory finger MF is one example of a region smaller than the memory block MB which is the minimum unit of the erase operation. Of course, it is possible for the pulse width T to be changed every completion of the erase operation in a region smaller than the memory block MB different from this memory finger MF.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. For example, similar advantages to those of the second embodiment can be displayed also by blunting a rise waveform of the erase voltage Vera applied in the first time of the erase operation in the first embodiment, instead of the second embodiment where an erase voltage Vera of small pulse width T is applied in the first time of the erase operation. The accompanying claims and their equivalents are intended to cover such forms or modifications as would fall within the scope and spirit of the inventions.

What is claimed is:

1. A semiconductor memory device, comprising:
 a memory cell array including a plurality of charge accumulation type memory cells; and
 a control unit that controls the memory cell array, wherein
 when executing an erase operation on the memory cell array, the control unit is operative to apply an erase voltage in a pulse form to channels of the memory cells, and
 the control unit performs control that increases a voltage value and shortens a pulse width of the erase voltage when the erase operation is in a second stage later than the first stage, compared to when the erase operation is in a first stage.

2. The semiconductor memory device according to claim 1, wherein
 the control unit is configured capable of executing:
 an erase verify operation that determines whether a threshold voltage of the memory cells which are to be a target of the erase operation has reached a certain value, or not; and
 a step-up operation that increases the voltage value of the erase voltage when it has been determined by the erase verify operation that the threshold voltage of the memory cells which are to be a target of the erase operation has not reached the certain value.

3. The semiconductor memory device according to claim 2, wherein
 the control unit performs control that, when the voltage value of the erase voltage has reached a reference value, shortens the pulse width of the erase voltage.

4. The semiconductor memory device according to claim 3, wherein
 the memory cell array includes a first region and a second region each being a unit of the erase operation, and
 the control unit sets mutually different reference values respectively corresponding to the first region and the second region.

5. The semiconductor memory device according to claim 3, further comprising
 a reference value storage unit that stores data related to the reference value,
 wherein the control unit reads the reference value from the reference value storage unit to execute control of the pulse width.

6. The semiconductor memory device according to claim 2, wherein
 the control unit performs control that, when the number of times of executions of the step-up operation has reached a certain number of times, shortens the pulse width of the erase voltage.

7. The semiconductor memory device according to claim 1, wherein the control unit, when the erase operation is in an initial stage, sets the pulse width of the erase voltage to a first pulse width, subsequently, when the erase operation is in the first stage, sets the pulse width of the erase voltage to a second pulse width longer than the first pulse width, and furthermore, when the erase operation is in the second stage, sets the pulse width of the erase voltage to a third pulse width shorter than the second pulse width.

8. The semiconductor memory device according to claim 1, wherein
the control unit performs control that, in the second stage, shortens the pulse width of the erase voltage in multiple stages.

9. The semiconductor memory device according to claim 8, wherein
the control unit performs control that shortens the pulse width of the erase voltage every time the erase operation of a region smaller than a region which is a unit of the erase operation in the memory cell array, is completed.

10. The semiconductor memory device according to claim 1, wherein
the memory cell array comprises:
a plurality of conductive layers stacked above a semiconductor substrate;
a semiconductor layer whose periphery is surrounded by the stacked conductive layers and which extends having as its longitudinal direction a first direction perpendicular to the substrate; and
a memory gate insulating film disposed between the semiconductor layer and the stacked conductive layers and including a charge accumulation layer.

11. The semiconductor memory device according to claim 10, wherein
the memory gate insulating film comprises: a tunnel insulating layer positioned closer to the semiconductor layer than the charge accumulation layer; the charge accumulation layer formed of an insulating film including a trap site of a charge; and a block insulating layer positioned closer to the stacked conductive layers than the charge accumulation layer.

12. A method of controlling an erase operation of a semiconductor memory device,
the semiconductor memory device comprising a memory cell array including a plurality of charge accumulation type memory cells,
the method comprising:
during the erase operation,
applying an erase voltage in a pulse form to channels of the memory cells; and
compared to when the erase operation is in a first stage, increasing a voltage value and setting a pulse width of the erase voltage shorter when the erase operation is in a second stage later than the first stage.

13. The method according to claim 12, further comprising:
executing an erase verify operation that determines whether a threshold voltage of the memory cells which are to be a target of the erase operation has reached a certain value, or not; and
executing a step-up operation that, when it has been determined by the erase verify operation that the threshold voltage of the memory cells which are to be a target of the erase operation has not reached the certain value, increases the voltage value of the erase voltage.

14. The method according to claim 13, wherein
when the voltage value of the erase voltage has reached a reference value, the pulse width of the erase voltage is shortened.

15. The method according to claim 14, wherein
the memory cell array includes a first region and a second region, the first region and the second region being a unit of the erase operation, respectively, and
the method comprises setting mutually different reference values respectively corresponding to the first region and the second region.

16. The method according to claim 14, wherein
the reference value is read from a reference value storage unit to execute control of the pulse width.

17. The method according to claim 13, wherein
when the number of times of executions of the step-up operation has reached a certain number of times, the pulse width of the erase voltage is shortened.

18. The method according to claim 12, wherein
when the erase operation is in an initial stage, the pulse width of the erase voltage is set to a first pulse width, subsequently, when the erase operation is in the first stage, the pulse width of the erase voltage is set to a second pulse width longer than the first pulse width, and furthermore, when the erase operation is in the second stage, the pulse width of the erase voltage is set to a third pulse width shorter than the second pulse width.

19. The method according to claim 12, wherein
in the second stage, the pulse width of the erase voltage is shortened in multiple stages.

20. The method according to claim 19, wherein
the pulse width of the erase voltage is shortened every time the erase operation of a region smaller than a region which is a unit of the erase operation in the memory cell array, is completed.

* * * * *